US012796400B2

(12) United States Patent
Kashiwagi et al.

(10) Patent No.: US 12,796,400 B2
(45) Date of Patent: Nov. 10, 2026

(54) WORKPIECE PROCESSING APPARATUS AND WORKPIECE PROCESSING METHOD

(71) Applicant: EBARA CORPORATION, Tokyo (JP)

(72) Inventors: Makoto Kashiwagi, Tokyo (JP); Mao Izawa, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 523 days.

(21) Appl. No.: 18/547,889

(22) PCT Filed: Feb. 9, 2022

(86) PCT No.: PCT/JP2022/005070
§ 371 (c)(1),
(2) Date: Aug. 25, 2023

(87) PCT Pub. No.: WO2022/185865
PCT Pub. Date: Sep. 9, 2022

(65) Prior Publication Data

US 2024/0165759 A1 May 23, 2024

(30) Foreign Application Priority Data

Mar. 5, 2021 (JP) ................................ 2021-035047

(51) Int. Cl.
*H10P 72/78* (2026.01)
*B23Q 3/08* (2006.01)
*H10P 72/76* (2026.01)

(52) U.S. Cl.
CPC .............. *H10P 72/78* (2026.01); *B23Q 3/088* (2013.01); *H10P 72/7608* (2026.01)

(58) Field of Classification Search
CPC .... B25J 15/06; B25J 15/0616; B25J 15/0675; B25J 15/0683; B65G 2249/04–045;
(Continued)

(56) References Cited

U.S. PATENT DOCUMENTS 6,539,959 B1 * 4/2003 Ohroku .............. H10P 72/0414 134/1
2005/0074952 A1 4/2005 Miyamoto et al.
(Continued)

FOREIGN PATENT DOCUMENTS

JP H10189511 A * 7/1998
JP 2000-228383 A 8/2000
(Continued)

OTHER PUBLICATIONS

International Search Report issued in Patent Application No. PCT/JP2022/005070 dated Apr. 5, 2022.

*Primary Examiner* — Tyrone V Hall, Jr.
(74) *Attorney, Agent, or Firm* — Chrisman Gallo Tochtrop LLC

(57) ABSTRACT

The present invention relates to a workpiece processing apparatus and a workpiece processing method for processing a workpiece, such as a wafer, a substrate, or a panel. The workpiece processing apparatus (1) includes: a workpiece supporting device (10) configured to support the workpiece (W); and a processing head (20) configured to process the surface of the workpiece (W). The workpiece supporting device (10) has a fluid supply line (15) for passing fluid therethrough, and a Bernoulli chuck (12) coupled to the fluid supply line (15), the Bernoulli chuck (12) is configured to attract the surface of the workpiece (W) by emitting the fluid, and at least part of the Bernoulli chuck (12) is made of a conductive material and is grounded.

16 Claims, 6 Drawing Sheets

(58) Field of Classification Search
CPC ............. H10P 72/7608; H10P 72/7612; H10P 72/7614; H10P 72/78; H10P 72/0402; H10P 72/0411; H10P 72/0414
See application file for complete search history.

(56) References Cited

U.S. PATENT DOCUMENTS

| | | | | |
|---|---|---|---|---|
| 2006/0027323 | A1* | 2/2006 | Miya .................. | H10P 72/7608 156/345.23 |
| 2016/0300749 | A1 | 10/2016 | Iwasaka et al. | |
| 2018/0096879 | A1* | 4/2018 | Kon .................... | H10P 72/7611 |
| 2019/0035650 | A1* | 1/2019 | Nakai ................. | H10P 72/0414 |
| 2019/0118335 | A1 | 4/2019 | Kobayashi et al. | |

FOREIGN PATENT DOCUMENTS

| | | | |
|---|---|---|---|
| JP | 2006-049598 | A | 2/2006 |
| JP | 2010-016208 | A | 1/2010 |
| JP | 2019-077003 | A | 5/2019 |
| JP | 2020-184581 | A | 11/2020 |
| TW | 201117934 | A | 6/2011 |
| WO | 2015/083615 | A1 | 6/2015 |

* cited by examiner

WORKPIECE PROCESSING APPARATUS AND WORKPIECE PROCESSING METHOD

TECHNICAL FIELD

The present invention relates to a workpiece processing apparatus and a workpiece processing method for processing a workpiece, such as a wafer, a substrate, or a panel.

BACKGROUND ART

Devices, such as a memory circuit, a logic circuit, and an image sensor (e.g., a CMOS sensor) are becoming more highly integrated these days. In a process of forming such devices, foreign matter, such as fine particles or dust, may adhere to the devices. Foreign matter adhering to a device can cause a short-circuit between interconnects or can cause a circuit defect. Therefore, in order to enhance a reliability of the device, it is necessary to clean a workpiece on which the device is formed to remove the foreign matter on the workpiece.

Foreign matter, such as fine particles or dust, as described above may also adhere to a back surface (or a non-device surface) of the workpiece. If such foreign matter adheres to the back surface of the workpiece, the workpiece can separate from a stage reference plane of an exposure apparatus, or a surface of the workpiece can incline with respect to the stage reference plane. As a result, patterning shift or focal distance shift can occur. In order to prevent such problems, it is necessary to prevent the foreign matter from adhering to the back surface of the workpiece.

Conventionally, a Bernoulli chuck has been used as a mechanism for supporting a workpiece, such as a wafer, a substrate, or a panel. The Bernoulli chuck is configured to generate a suction force by emitting fluid using Bernoulli's theorem, and support the workpiece in a non-contact manner via the fluid.

CITATION LIST

Patent Literature

Patent document 1: Japanese laid-open patent publication No. 2019-77003

SUMMARY OF INVENTION

Technical Problem

FIG. 9 is a schematic diagram illustrating a Bernoulli chuck 112 when supporting a workpiece W. The Bernoulli chuck 112 supports a first surface 102*a* of the workpiece W in a non-contact manner by emitting fluid supplied from a fluid supply line 115. However, when the fluid is emitted from the Bernoulli chuck 112, the Bernoulli chuck 112 is electrically charged due to friction between the fluid and the Bernoulli chuck 112. If foreign matter, such as polishing debris, is generated near the Bernoulli chuck 112 during processing (e.g., polishing) of the workpiece W, the foreign matter is attracted to the Bernoulli chuck 112 and adheres to the Bernoulli chuck 112. The foreign matter causes contamination of the workpiece W. Similarly, the workpiece W is electrically charged due to friction between the fluid and the first surface 102*a* of the workpiece W, so that the same problem may occur.

It is therefore an object of the present invention to provide a workpiece processing apparatus capable of removing static electricity generated in a Bernoulli chuck during processing of a workpiece while the workpiece is supported by the Bernoulli chuck.

Solution to Problem

In an embodiment, there is provided a workpiece processing apparatus for processing a surface of a workpiece, comprising: a workpiece supporting device configured to support the workpiece; and a processing head configured to process the surface of the workpiece, wherein the workpiece supporting device has a fluid supply line for passing fluid therethrough, and a Bernoulli chuck coupled to the fluid supply line, the Bernoulli chuck is configured to attract the surface of the workpiece by emitting the fluid, and at least part of the Bernoulli chuck is made of a conductive material and is grounded.

In an embodiment, the fluid comprises gas, and the workpiece supporting device further has an ionizer configured to ionize the gas flowing through the fluid supply line.

In an embodiment, the fluid comprises carbonated water, the workpiece supporting device further has a carbonated-water supply source, and the fluid supply line is coupled to the carbonated-water supply source.

In an embodiment, the workpiece supporting device further has rollers configured to contact an edge portion of the workpiece, and at least part of each roller is made of a conductive material and is grounded.

In an embodiment, the conductive material comprises a conductive resin or a conductive ceramic.

In an embodiment, there is provided a workpiece processing apparatus for processing a surface of a workpiece, comprising: a workpiece supporting device configured to support the workpiece; and a processing head configured to process the surface of the workpiece, wherein the workpiece supporting device includes: a fluid supply line for passing gas therethrough; an ionizer configured to ionize the gas flowing through the fluid supply line; a Bernoulli chuck coupled to the fluid supply line and configured to attract the surface of the workpiece by emitting the ionized gas; a liquid ejecting member surrounding the Bernoulli chuck and configured to emit carbonated water around the Bernoulli chuck; and a carbonated-water supply source for supplying the carbonated water to the liquid ejecting member.

In an embodiment, at least a part of the Bernoulli chuck and/or at least a part of the liquid ejecting member is made of a conductive material and is grounded.

In an embodiment, the workpiece supporting device further has rollers configured to contact an edge portion of the workpiece, and at least part of each roller is made of a conductive material and is grounded.

In an embodiment, the conductive material comprises a conductive resin or a conductive ceramic.

In an embodiment, there is provided a workpiece processing method of processing a surface of a workpiece, comprising: attracting the surface of the workpiece by a Bernoulli chuck by emitting fluid from the Bernoulli chuck; and processing the surface of the workpiece by a processing head while the workpiece is attracted by the Bernoulli chuck, wherein at least part of the Bernoulli chuck is made of a conductive material and is grounded.

In an embodiment, the fluid emitted from the Bernoulli chuck comprises an ionized gas.

In an embodiment, the fluid emitted from the Bernoulli chuck comprises carbonated water.

In an embodiment, the workpiece processing method further comprises bringing rollers into contact with an edge portion of the workpiece to support the workpiece, wherein at least part of each roller is made of a conductive material and is grounded.

In an embodiment, there is provided a workpiece processing method of processing a surface of a workpiece, comprising: emitting carbonated water to the surface of the workpiece from a liquid ejecting member surrounding a Bernoulli chuck, while attracting the surface of the workpiece by the Bernoulli chuck by emitting an ionized gas from the Bernoulli chuck; and processing the surface of the workpiece by a processing head while the workpiece is attracted by the Bernoulli chuck.

In an embodiment, at least a part of the Bernoulli chuck and/or at least a part of the liquid ejecting member is made of a conductive material and is grounded.

In an embodiment, the workpiece processing method further comprises bringing rollers into contact with an edge portion of the workpiece to support the workpiece, wherein at least part of each roller is made of a conductive material and is grounded.

Advantageous Effects of Invention

According to the present invention, at least part of the Bernoulli chuck is made of the conductive material and is grounded, so that static electricity generated in the Bernoulli chuck can be removed.

Further, according to the present invention, static electricity generated in the Bernoulli chuck can be removed by passing the ionized gas and/or the carbonated water through the Bernoulli chuck.

Furthermore, according to the present invention, at least part of the roller is made of the conductive material and is grounded, so that static electricity generated in the workpiece can be removed.

DESCRIPTION OF EMBODIMENTS

Figure 1:
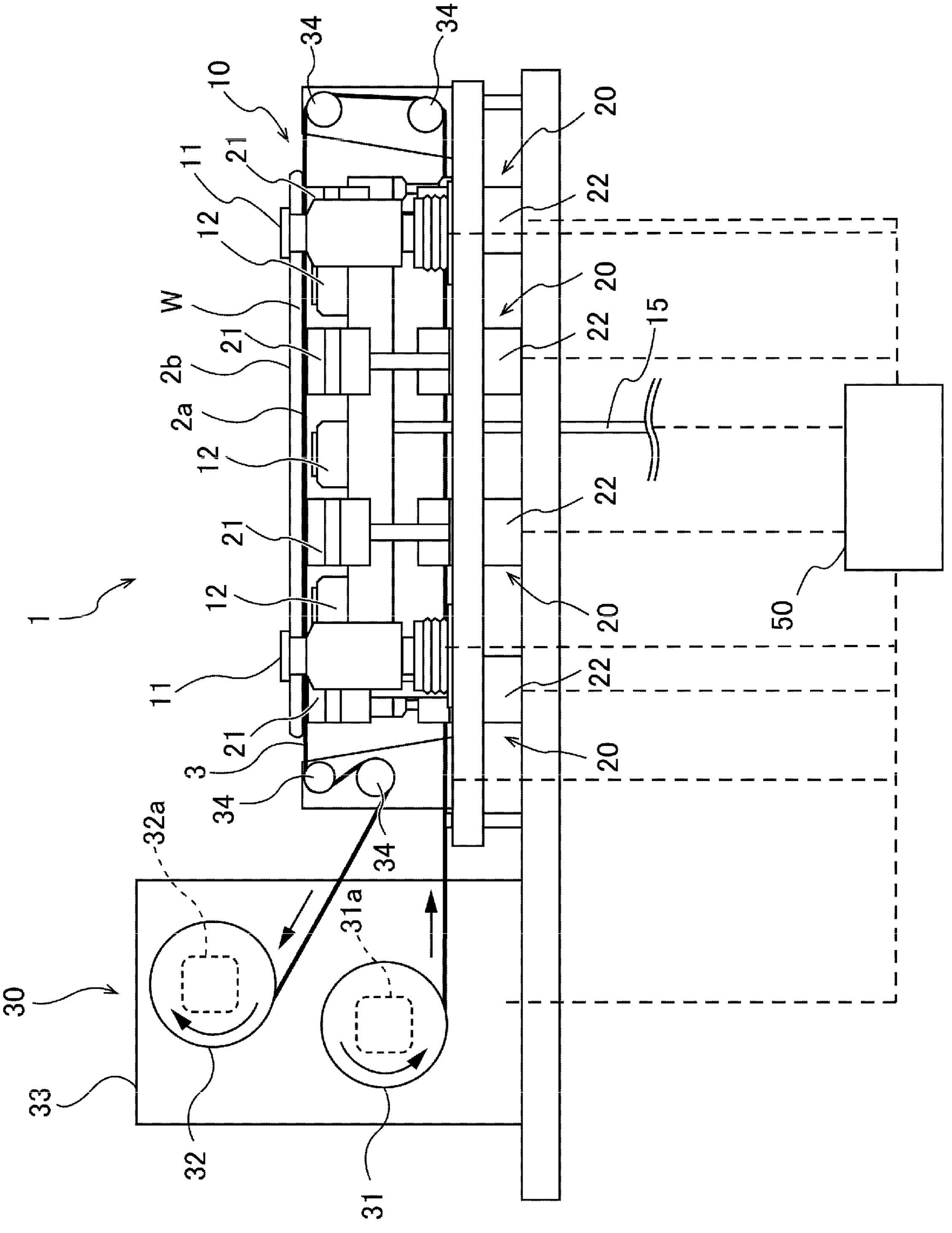
FIG. 1 is a schematic diagram showing an embodiment of a polishing apparatus.

Hereinafter, embodiments of the present invention will be described with reference to the drawings. Identical or corresponding elements are denoted by the same reference numerals, and their repetitive explanations will be omitted.

FIG. 1 is a schematic diagram showing an embodiment of a polishing apparatus 1. The polishing apparatus 1 shown in FIG. 1 is an example of a workpiece processing apparatus for processing a workpiece W, such as a wafer, a substrate, or a panel. The polishing apparatus 1 includes a workpiece supporting device 10 configured to support the workpiece W, polishing heads 20 each configured to bring a polishing tape 3 as a processing tool into sliding contact with a first surface 2*a* of the workpiece W to polish the first surface 2*a* of the workpiece W, and a polishing-tape feeding mechanism 30 configured to feed the polishing tape 3 to the polishing heads 20. Each polishing head 20 is an example of a processing head configured to process a surface of the workpiece W. In this embodiment, four polishing heads 20 are provided, while the number of polishing heads 20 is not limited to this embodiment. For example, one, two, three, five or more polishing heads 20 may be provided.

The workpiece supporting device 10 includes a plurality of rollers 11 which can contact a periphery of the workpiece W, and a plurality of Bernoulli chucks 12 configured to support the first surface (or a lower surface) 2*a* of the workpiece W with fluid. The workpiece supporting device 10 includes a roller rotating mechanism (not shown) configured to rotate each roller 11 about the central axis of the roller 11. The Bernoulli chucks 12 are configured to attract the first surface 2*a* of the workpiece W via flows of the fluid, and support the workpiece W in a non-contact manner. In this specification, each Bernoulli chuck 12 is defined as a chuck configured to emit fluid to generate a suction force utilizing Bernoulli's theorem.

In this embodiment, the first surface 2*a* of the workpiece W is a back surface of the workpiece W on which no device is formed or device is not to be formed, i.e., a non-device surface. A second surface 2*b* of the workpiece W, which is opposite the first surface 2*a*, is a surface on which devices are formed or devices are to be formed, i.e., a device surface. In this embodiment, the workpiece W is horizontally supported by the workpiece supporting device 10 with the first surface 2*a* facing downward.

The polishing heads 20 are disposed at a lower side of the workpiece W supported by the workpiece supporting device 10. Each polishing head 20 includes a pressing member 21 configured to press the polishing tape 3 against the first surface 2*a* of the workpiece W, and a pressing mechanism 22 configured to push the pressing member 21 upward. The pressing mechanism 22 pushes the pressing member 21 upward to cause the pressing member 21 to bring the polishing tape 3 into sliding contact with the first surface 2*a* of the workpiece W from a back side of the polishing tape 3 to thereby polish the first surface 2*a* of the workpiece W with the polishing tape 3.

The polishing-tape feeding mechanism 30 includes a tape feeding reel 31 configured to feed the polishing tape 3, and a tape take-up reel 32 configured to collect the polishing tape 3. The tape feeding reel 31 and the tape take-up reel 32 are coupled to tension motors 31*a* and 32*a*, respectively. The tension motors 31*a* and 32*a* are fixed to a reel base 33. The polishing tape 3 is advanced or fed from the tape feeding reel 31 to the tape take-up reel 32 via the polishing heads 20 in a direction indicated by arrows by rotating the tape take-up reel 32 in a direction indicated by an arrow. A plurality of guide rollers 34 are arranged to guide the polishing tape 3 such that the polishing tape 3 advances in a direction parallel to the first surface 2*a* of the workpiece W. The plurality of guide rollers 34 are fixed to a not-shown holding member.

The tension motor 31*a* can apply tension to the polishing tape 3 by applying a predetermined torque to the tape feeding reel 31. The tension motor 32*a* is controlled so as to advance the polishing tape 3 at a constant speed. An advancing speed of the polishing tape 3 can be changed by changing a rotating speed of the tape take-up reel 32. In one embodiment, the advancing direction of the polishing tape 3 may be opposite to the direction indicated by the arrows in FIG. 1 (i.e., arrangements of the tape feeding reel 31 and the tape take-up reel 32 may be interchanged). A tape advancing device may be provided in addition to the tape take-up reel 32. In this case, the tension motor 32*a* coupled to the tape take-up reel 32 can apply tension to the polishing tape 3 by applying a predetermined torque to the tape take-up reel 32.

The polishing apparatus 1 may further include a rinsing-liquid supply nozzle (not shown) and a protective-liquid supply nozzle (not shown). The rinsing-liquid supply nozzle is arranged below the workpiece W to supply a rinsing liquid (e.g., pure water or an alkaline chemical liquid) onto the first surface 2*a* of the workpiece W. The rinsing liquid supplied to a processing point of the first surface 2*a* can remove polishing debris from the first surface 2*a* of the workpiece W. In addition, the rinsing liquid supplied to area(s) other than the processing point can prevent the workpiece W from drying. The protective-liquid supply nozzle is arranged above the workpiece W to supply a protective liquid (e.g., pure water) onto the second surface 2*b* of the workpiece W. The protection liquid spreads over the second surface 2*b* of the workpiece W by centrifugal force to prevent the rinsing liquid containing polishing debris or foreign matter generated in the polishing of the workpiece W from contacting the second surface 2*b* of the workpiece W.

Operations of the polishing apparatus 1 are controlled by an operation controller 50. The operation controller 50 is electrically connected to the rollers 11 of the workpiece supporting device 10, the polishing heads 20, and the polishing-tape feeding mechanism 30. Operations of the rollers 11 of the workpiece supporting device 10, the polishing heads 20, and the polishing-tape feeding mechanism 30 are controlled by the operation controller 50. The operation controller 50 is composed of at least one computer.

Figure 2:
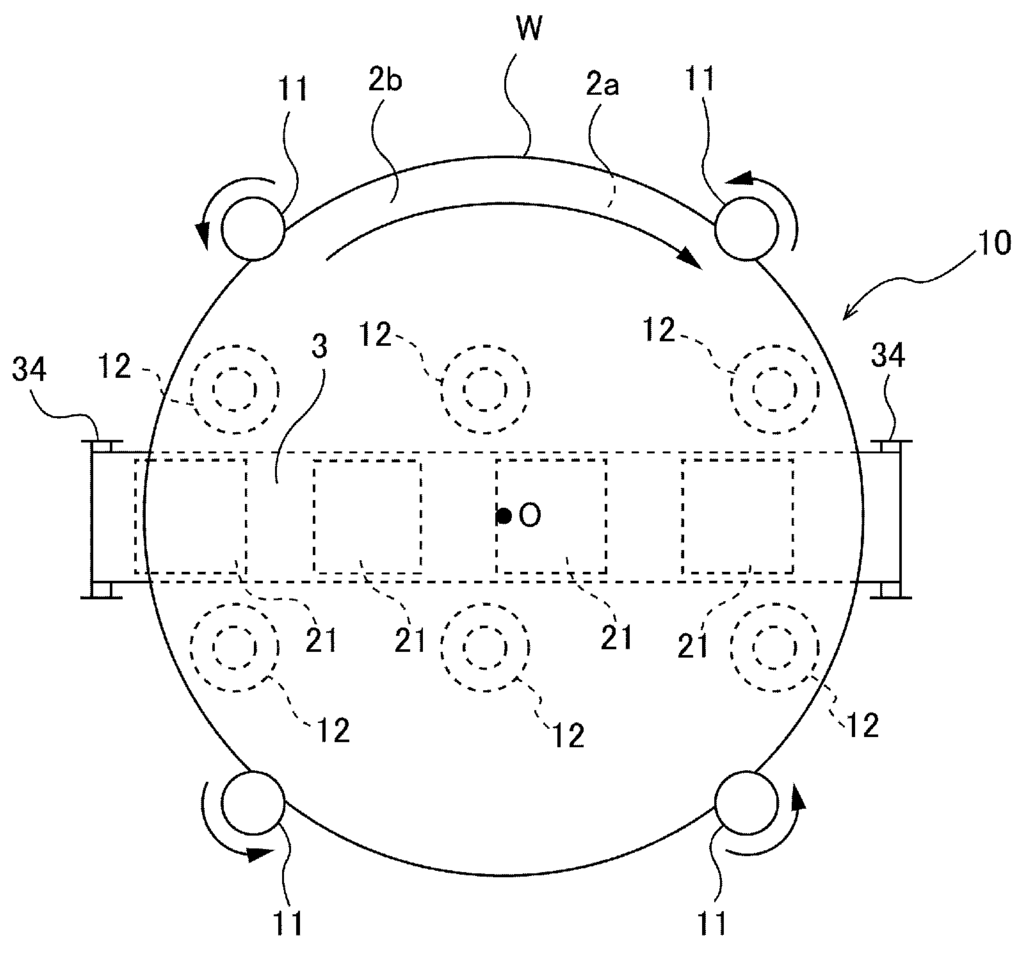
FIG. 2 is a plan view illustrating a workpiece supporting device when supporting a workpiece.

FIG. 2 is a plan view illustrating the workpiece supporting device 10 when supporting the workpiece W. The periphery of the workpiece W is held by the four rollers 11, and the first surface 2*a* of the workpiece W is supported by the six Bernoulli chucks 12. The four rollers 11 are arranged around a reference central point O of the workpiece supporting device 10. The roller rotating mechanism (not shown) is configured to rotate the four rollers 11 in the same direction at the same speed. During polishing of the first surface 2*a* of the workpiece W, the periphery of the workpiece W is held by the rollers 11. The workpiece W is held horizontally, and is rotated about its own axis by the rotations the rollers 11. During the polishing of the first surface 2*a* of the workpiece W, the four rollers 11 rotate about their respective own axes, while positions of the rollers 11 themselves remain stationary. In this embodiment, the four rollers 11 are provided, while the number of rollers is not limited to this embodiment. For example, five or more rollers may be provided. In one embodiment, the workpiece W may be held by the plurality of rollers 11 so as to tilt with respect to the horizontal direction.

The workpiece W is further supported by the plurality of Bernoulli chucks 12. These Bernoulli chucks 12 are arranged at both sides of the polishing tape 3 and the pressing members 21. Three Bernoulli chucks 12 are located at one side of the polishing tape 3 supported by the pressing members 21 and are aligned along the polishing tape 3. Similarly, three Bernoulli chucks 12 are located at the other side of the polishing tape 3 supported by the pressing members 21 and are aligned along the polishing tape 3. Each of the six Bernoulli chucks 12 is located away from the polishing tape 3 and the pressing members 21, but is adjacent to the polishing tape 3 and the pressing members 21. In this embodiment, the six workpiece supporting devices 12 are provided, while the number and positions of Bernoulli chucks 12 are not limited to this embodiment. For example, only one Bernoulli chuck 12 may be provided.

Figure 3:
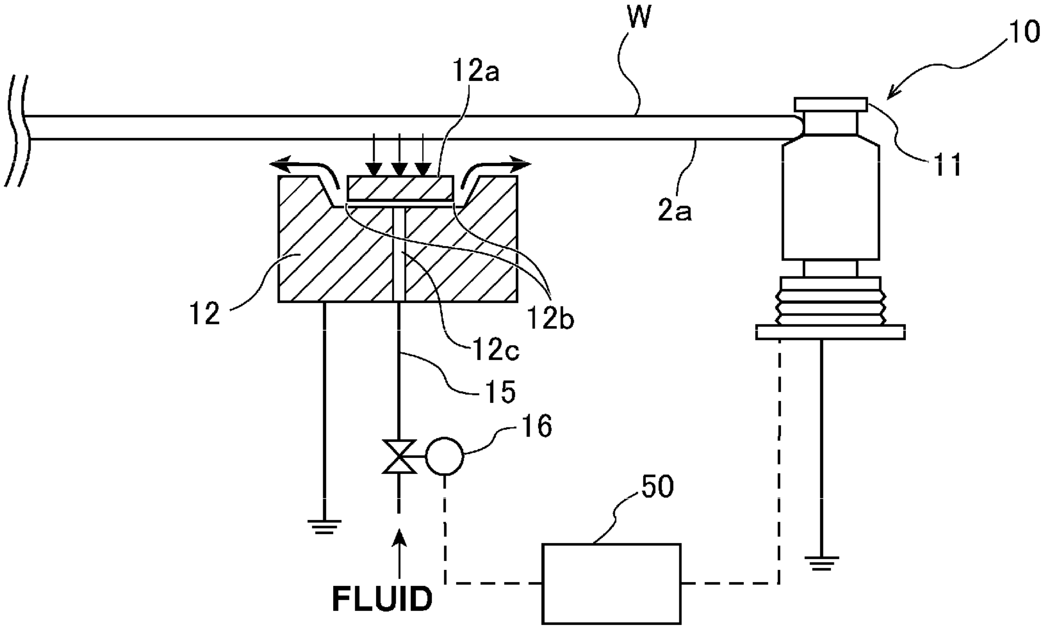
FIG. 3 is a schematic diagram showing an embodiment of the workpiece supporting device.

FIG. 3 is a schematic diagram showing an embodiment of the workpiece supporting device 10. In FIG. 3, only one roller 11 and only one Bernoulli chuck 12 are depicted as a part of configurations of the workpiece supporting device 10, while configurations of the rollers 11 and the Bernoulli chucks 12 of the workpiece supporting device 10 described with reference to FIGS. 1 and 2 are the same as those of the roller 11 and the Bernoulli chuck 12 shown in FIG. 3. The Bernoulli chuck 12 is depicted in cross section. The Bernoulli chuck 12 has an attracting surface 12*a* facing upward, and this attracting surface 12*a* faces the first surface (lower surface) 2*a* of the workpiece W. The Bernoulli chuck 12 has fluid ejecting ports 12*b* located around the attracting surface 12*a*, and a fluid flow passage 12*c* communicating with the fluid ejecting ports 12*b*. The fluid flow passage 12*c* communicates with a fluid supply line 15 configured to supply fluid. The fluid is gas (e.g., dry air, inert gas, etc.) or liquid (e.g., pure water, etc.). The fluid supply line 15 is coupled to a not-shown fluid supply source. A fluid supply valve 16 is attached to the fluid supply line 15, and the fluid supply valve 16 is electrically connected to the operation controller 50. Operations of the fluid supply valve 16 are controlled by the operation controller 50. Examples of the fluid supply valve 16 include an actuator-driven valve, such as a motor-driven valve and an electromagnetic valve.

When the operation controller 50 opens the fluid supply valve 16, the fluid is supplied to the Bernoulli chuck 12 through the fluid supply line 15. The fluid supplied to the Bernoulli chuck 12 flows through the fluid flow passage 12*c* and is emitted from the fluid ejecting ports 12*b* toward an outside of the Bernoulli chuck 12. A flow of the fluid spreading outward from the attracting surface 12*a* generates a negative pressure in a space between a central portion of the attracting surface 12*a* and the first surface 2*a* of the workpiece W. As a result, the Bernoulli chuck 12 generates a suction force at the central portion of the attracting surface 12*a* to attract the workpiece W. A flow of the fluid is formed in a space between a peripheral portion of the Bernoulli chuck 12 and the first surface 2*a* of the workpiece W, so that the first surface 2*a* of the workpiece W is supported by this flow of the fluid. In this way, the Bernoulli chucks 12 can support the workpiece W in a non-contact manner while attracting the workpiece W. Therefore, the rollers 11 can rotate the workpiece W while the Bernoulli chucks 12 support the workpiece W.

Each Bernoulli chuck 12 of this embodiment is configured to radially emit the fluid from the fluid ejecting ports 12*b* toward the outside of the Bernoulli chuck 12. The Bernoulli chuck 12 is not limited to this embodiment as long as the Bernoulli chuck 12 can attract the first surface 2*a* of the workpiece W by the flow of the fluid and can support the workpiece W in a non-contact manner. For example, a cyclone-type Bernoulli chuck may be applied. The cyclone-type Bernoulli chuck is configured to attract the first surface 2*a* of the workpiece W and support the workpiece W in a non-contact manner by forming a swirling flow of the fluid to cause the fluid to flow toward the outside of the Bernoulli chuck 12.

At least part of each Bernoulli chuck 12 is made of a conductive material and is grounded. In particular, a portion of the Bernoulli chuck 12, which faces the first surface 2*a* of workpiece W and includes the attracting surface 12*a* and the fluid ejecting port 12*b*, is made of a conductive material and is grounded. Similarly, at least part of each roller 11 is made of a conductive material and is grounded. In particular, a portion of the roller 11 which is in contact with the workpiece W is made of a conductive material and is grounded. Examples of the conductive material forming the Bernoulli chuck 12 and the roller 11 include a conductive resin, a conductive ceramic, etc. The conductive resin may contain a resin, such as PEEK (polyetheretherketone), PPS (polyphenylene sulfide), or PVC (polyvinyl chloride), mixed with a conductive filler.

Figure 4:
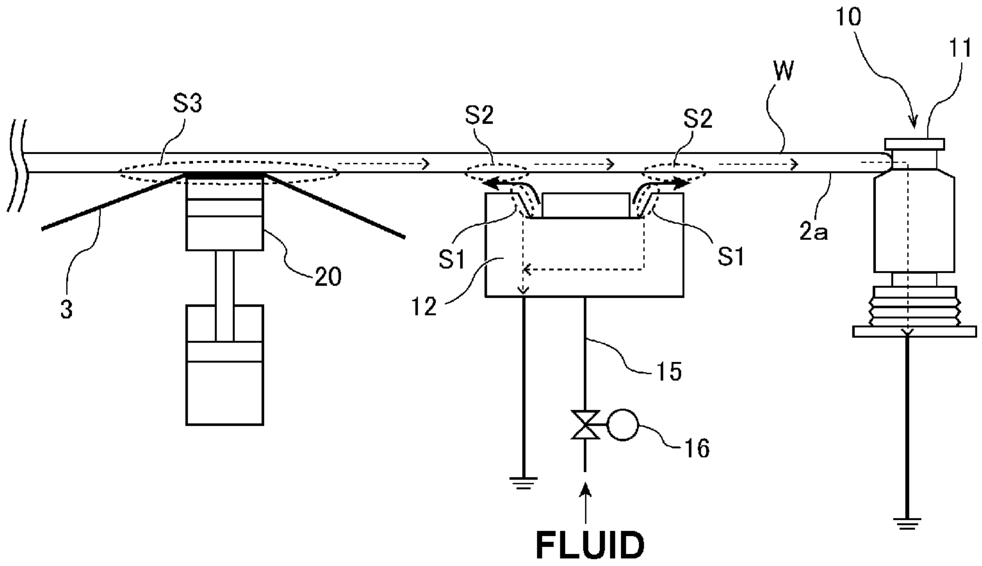
FIG. 4 is a schematic diagram illustrating the workpiece when being polished while the workpiece supporting device shown in FIG. 3 supports the workpiece.

FIG. 4 is a schematic diagram illustrating the workpiece W when being polished while the workpiece supporting device 10 shown in FIG. 3 supports the workpiece W. The workpiece W is supported by the workpiece supporting device 10. The polishing head 20 polishes the first surface 2*a* of the workpiece W by bringing the polishing tape 3, which is a processing tool, into sliding contact with the first surface 2*a* of the workpiece W. When the fluid is emitted from the Bernoulli chuck 12, the Bernoulli chuck 12 is electrically charged due to friction between the fluid and the Bernoulli chuck 12. Similarly, the workpiece W is electrically charged due to friction between the fluid and the first surface 2*a* of the workpiece W and friction between the polishing tape 3 and the workpiece W. Foreign matter, such as polishing debris, may be attracted and attached to the charged Bernoulli chuck 12 and the charged workpiece W. As a result, the foreign matter may cause contamination of the workpiece W.

Thus, each Bernoulli chuck 12 of this embodiment is made of the conductive material and is grounded. Static electricity generated in portions of the Bernoulli chuck 12 which are indicated by S1 can be removed from the Bernoulli chuck 12 as indicated by dashed arrows. Furthermore, each roller 11 of this embodiment is made of the conductive material and is grounded. Static electricity generated in portions of the workpiece W which are indicated by S2 and S3 can be removed from the workpiece W via the roller 11 as indicated by dashed arrows.

Figure 5:
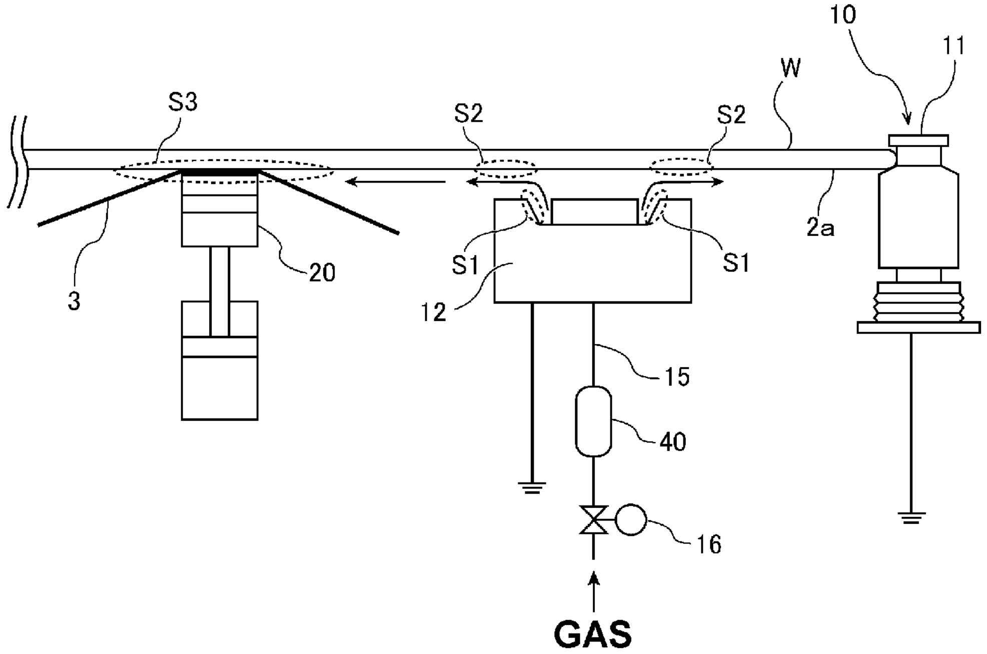
FIG. 5 is a schematic diagram showing another embodiment of the workpiece supporting device.

FIG. 5 is a schematic diagram showing another embodiment of the workpiece supporting device 10. Configurations of this embodiment, which will not be particularly described, are the same as those of the above-described embodiment described with reference to FIGS. 3 and 4, and duplicated descriptions will be omitted. Gas is supplied from the fluid supply line 15 to the Bernoulli chuck 12 shown in FIG. 5. The fluid supply line 15 is coupled to a not-shown gas supply source. Therefore, the fluid ejecting ports 12*b* (see FIG. 3) of this embodiment are gas ejecting ports.

The workpiece supporting device 10 includes an ionizer 40 configured to ionize the gas flowing through the fluid supply line 15. The ionizer 40 is provided downstream of the fluid supply valve 16 in a flow direction of the gas flowing through the fluid supply line 15. In one embodiment, the ionizer 40 may be provided upstream of the fluid supply valve 16 in the flow direction of the gas flowing through the fluid supply line 15. An ionized gas contains positively charged ions and negatively charged ions. A pipe of the fluid supply line 15 is made of a conductive material, such as a conductive resin, in order to retain the ions in the gas flowing through the fluid supply line 15.

The ionized gas flows into the Bernoulli chuck 12, flows through the Bernoulli chuck 12, and is emitted from the Bernoulli chuck 12. The ionized gas emitted from the Bernoulli chuck 12 spreads along the first surface 2*a* of the workpiece W. In FIG. 5, the ionized gas emitted from the Bernoulli chuck 12 is indicated by solid arrows. The ionized gas can neutralize the charge in the charged portions to be able to remove the static electricity. Therefore, the Bernoulli chuck 12 of this embodiment can remove the static electricity from the charged portions indicated by S1 and S2. Furthermore, the ionized gas spreads along the first surface 2*a* of the workpiece W and reaches the charged portion S3, so that the static electricity can be removed from the charged portion S3.

Figure 6:
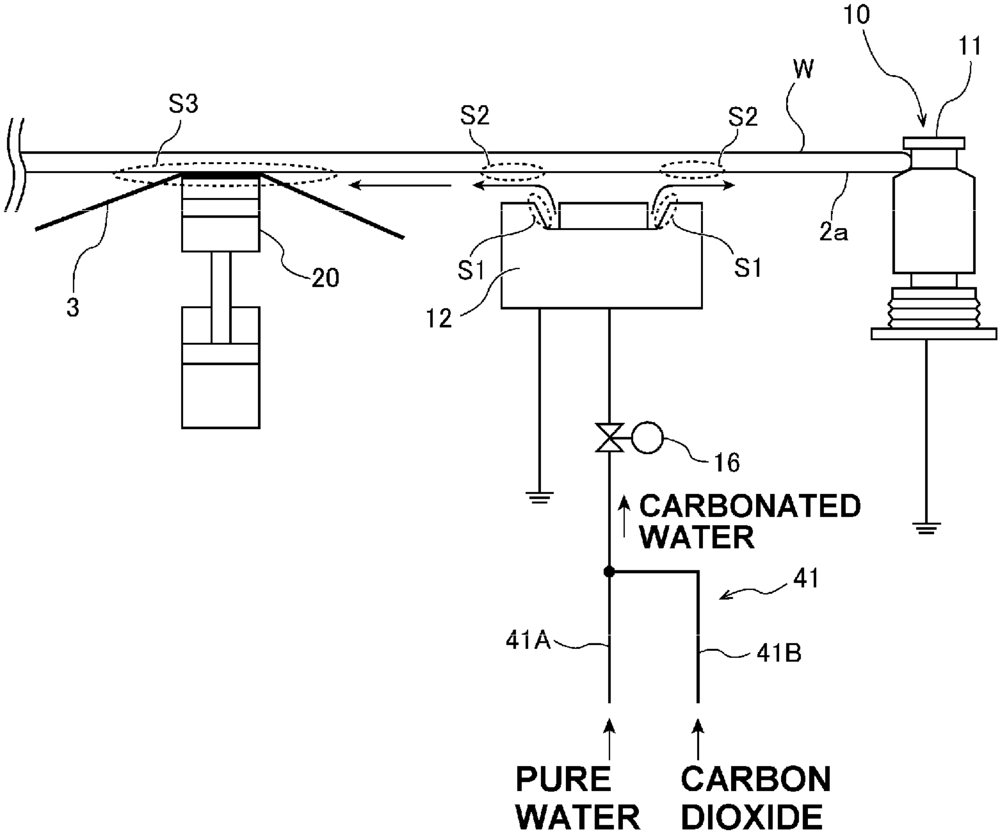
FIG. 6 is a schematic diagram showing still another embodiment of the workpiece supporting device.

FIG. 6 is a schematic diagram showing still another embodiment of the workpiece supporting device 10. Configurations of this embodiment, which will not be particularly described, are the same as those of the above-described embodiment described with reference to FIGS. 3 and 4, and duplicated descriptions will be omitted. Carbonated water is supplied from the fluid supply line 15 to the Bernoulli chuck 12 shown in FIG. 6. The workpiece supporting device 10 has a carbonated-water supply source 41, and the fluid supply line 15 is coupled the carbonated-water supply source 41. Therefore, the fluid ejecting ports 12*b* (see FIG. 3) of this embodiment are carbonated-water ejecting ports. In this embodiment, the carbonated-water supply source 41 includes a pure-water line 41A through which pure water flows, and a carbon-dioxide-gas line 41B through which carbon dioxide gas flows. The pure-water line 41A is coupled to the carbon-dioxide-gas line 41B, and the pure water and the carbon dioxide gas are mixed to produce the carbonated water. In one embodiment, the carbonated-water supply source 41 may be a carbonated-water tank configured to store the carbonated water therein. The carbonated water contains positively charged hydrogen ions and negatively charged carbonate ions and hydrogen carbonate ions. The pipe of the fluid supply line 15 is made of a conductive material, such as a conductive resin, in order to retain the ions in the carbonated water flowing through the fluid supply line 15.

The carbonated water flows into the Bernoulli chuck 12, flows through the Bernoulli chuck 12, and is emitted from the Bernoulli chuck 12. The carbonated water emitted from the Bernoulli chuck 12 spreads along the first surface 2*a* of the workpiece W. In FIG. 6, the carbonated water emitted from the Bernoulli chuck 12 is indicated by solid arrows. The carbonated water can neutralize the charge in the charged portions to be able to remove the static electricity. Therefore, the Bernoulli chuck 12 of this embodiment can remove the static electricity from the charged portions indicated by S1 and S2. Furthermore, the carbonated water spreads along the first surface 2*a* of the workpiece W and reaches the charged portion S3 of the workpiece W, so that the static electricity can be removed from the charged portion S3.

Figure 7A:
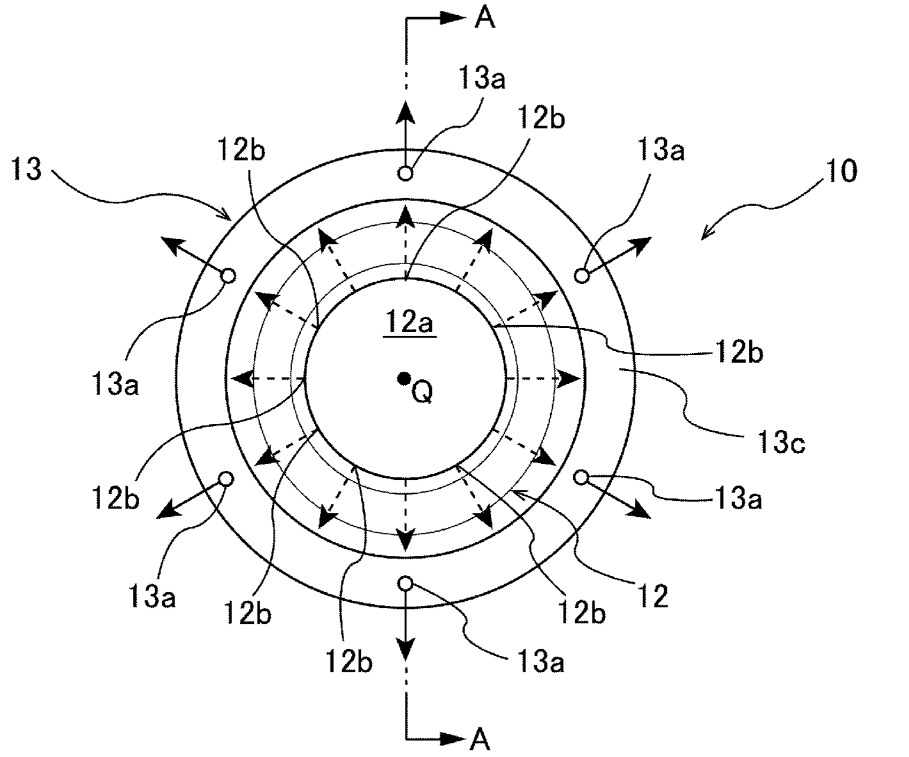
FIG. 7A is a plan view showing still another embodiment of the workpiece supporting device.
Figure 7B:
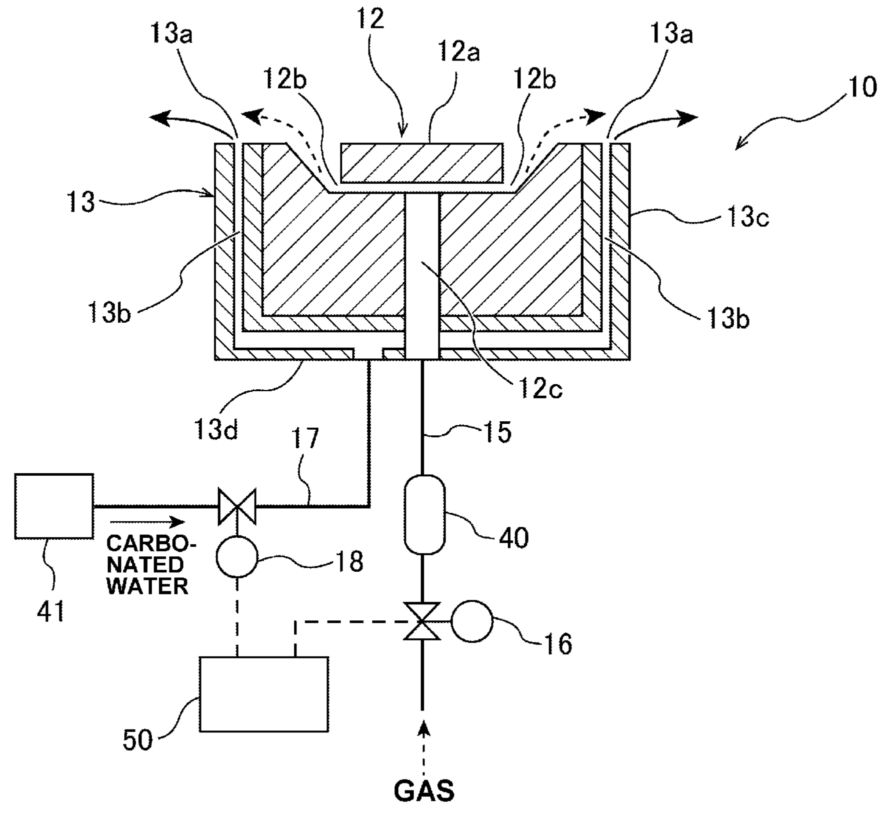
FIG. 7B is a cross-sectional view taken along a line A-A of FIG. 7A.

FIG. 7A is a plan view showing still another embodiment of the workpiece supporting device, and FIG. 7B is a cross-sectional view taken along a line A-A of FIG. 7A. Configurations of this embodiment, which will not be particularly described, are the same as those of the above-described embodiment described with reference to FIG. 5, and duplicated descriptions will be omitted. In FIGS. 7A and 7B, depiction of the rollers 11 of the workpiece supporting device 10 is omitted. An ionized gas is supplied from the fluid supply line 15 to the Bernoulli chuck 12. Configurations of the Bernoulli chuck 12 are the same as those of the embodiment described with reference to FIG. 5. Therefore, the fluid ejecting ports 12*b* of this embodiment are gas ejecting ports.

The workpiece supporting device 10 of this embodiment includes a liquid ejecting member 13 located so as to surround the Bernoulli chuck 12. The liquid ejecting member 13 is coupled to a carbonated-water supply line 17, and carbonated water is supplied to the liquid ejecting member 13 from the carbonated-water supply line 17. The workpiece supporting device 10 has a carbonated-water supply source 41. The carbonated-water supply line 17 is coupled to the carbonated-water supply source 41. In FIG. 7B, the carbonated-water supply source 41 is schematically depicted, while configurations of the carbonated-water supply source 41 may be the same as those of the embodiment described with reference to FIG. 6. Alternatively, the carbonated-water supply source 41 may be a carbonated-water tank configured to store the carbonated water therein.

The liquid ejecting member 13 has a plurality of liquid ejecting ports 13*a*, a plurality of liquid flow passages 13*b*, a side wall 13*c* surrounding the Bernoulli chuck 12, and a bottom 13*d* coupled to the side wall 13*c*. An inner diameter of the side wall 13*c* is larger than an outer diameter of the Bernoulli chuck 12, and the Bernoulli chuck 12 is located inside the liquid ejecting member 13.

The liquid ejecting ports 13*a* are a plurality of holes formed in an upper surface of the liquid ejecting member 13. These liquid ejecting ports 13*a* are located on the same circumference at equal intervals when viewed from above the liquid ejecting member 13. The liquid ejecting ports 13*a* are formed in an upper surface of the side wall 13*c*, and are located so as to surround the Bernoulli chuck 12.

The liquid flow passages 13*b* extend in the side wall 13*c* downward from the liquid ejecting ports 13*a* toward the bottom 13*d*, further extend in the bottom 13*d*, and join together at a central portion of the bottom 13*d*. The liquid flow passages 13*b* communicate with the carbonated-water supply line 17 configured to supply the carbonated water to the liquid ejecting member 13. A carbonated-water supply valve 18 is attached to the carbonated-water supply line 17, and the carbonated-water supply valve 18 is electrically connected to the operation controller 50. Operations of the carbonated-water supply valve 18 are controlled by the operation controller 50. Examples of the carbonated-water supply valve 18 include an actuator-driven valve, such as a motor-driven valve and an electromagnetic valve.

As shown in FIG. 7A, the fluid ejecting ports 12*b*, which are the gas ejecting ports, are located on the same circumference at equal intervals when viewed from above the Bernoulli chuck 12. The liquid ejecting ports 13*a* of the liquid ejecting member 13 are located on a plurality of straight lines extending from the center Q of the Bernoulli chuck 12 through the fluid ejecting ports 12*b* when viewed from above the liquid ejecting member 13. In this embodiment, twelve fluid ejecting ports 12*b* and six liquid ejecting ports 13*a* are provided, while the number, shapes, and positions of the fluid ejecting ports 12*b* and the liquid ejecting ports 13*a* shown in FIGS. 7A and 7B are an example, and are not particularly limited.

The Bernoulli chuck 12 of this embodiment is configured to radially emit the ionized gas from the fluid ejecting port 12*b* toward the outside of the Bernoulli chuck 12. The Bernoulli chuck 12 is not limited to this embodiment as long as the Bernoulli chuck 12 can attract the first surface 2*a* of the workpiece W and can support the workpiece W in a non-contact manner by the flow of the ionized gas. For example, a cyclone-type Bernoulli chuck may be applied. The cyclone-type Bernoulli chuck is configured to attract the first surface 2*a* of the workpiece W and support the workpiece W in a non-contact manner by forming a swirling flow of the ionized gas to cause the ionized gas to flow toward the outside of the Bernoulli chuck 12.

The liquid ejecting member 13 of this embodiment has the side wall 13*c* surrounding the Bernoulli chuck 12, while the liquid ejecting member 13 is not limited to this embodiment as long as the liquid ejecting member 13 is configured to emit the carbonated water around the Bernoulli chuck 12. For example, the liquid ejecting port 13*a* of the liquid ejecting member 13 may have an annular shape along a circumference of the bottom 13*d* when viewed from above the liquid ejecting member 13. Alternatively, the liquid ejecting member 13 may not have the side wall 13*c*, and may instead include a plurality of liquid nozzles configured to emit the carbonated water around the Bernoulli chuck 12.

When the operation controller 50 opens the fluid supply valve 16 and the carbonated-water supply valve 18, the ionized gas is supplied to the Bernoulli chuck 12 and the carbonated water is supplied to the liquid ejecting member 13. The ionized gas supplied to the Bernoulli chuck 12 flows through the fluid flow passage 12*c*, and is radially emitted from the plurality of fluid ejecting ports 12*b* toward the outside of the Bernoulli chuck 12. The carbonated water supplied to the liquid ejecting member 13 flows through the liquid flow passages 13*b*, and is emitted from the plurality of liquid ejecting ports 13*a* toward an outside of the liquid ejecting member 13. Dashed arrows in FIGS. 7A and 7B represent the flow of the ionized gas, and solid arrows represent the flow of the carbonated water.

Figure 8:
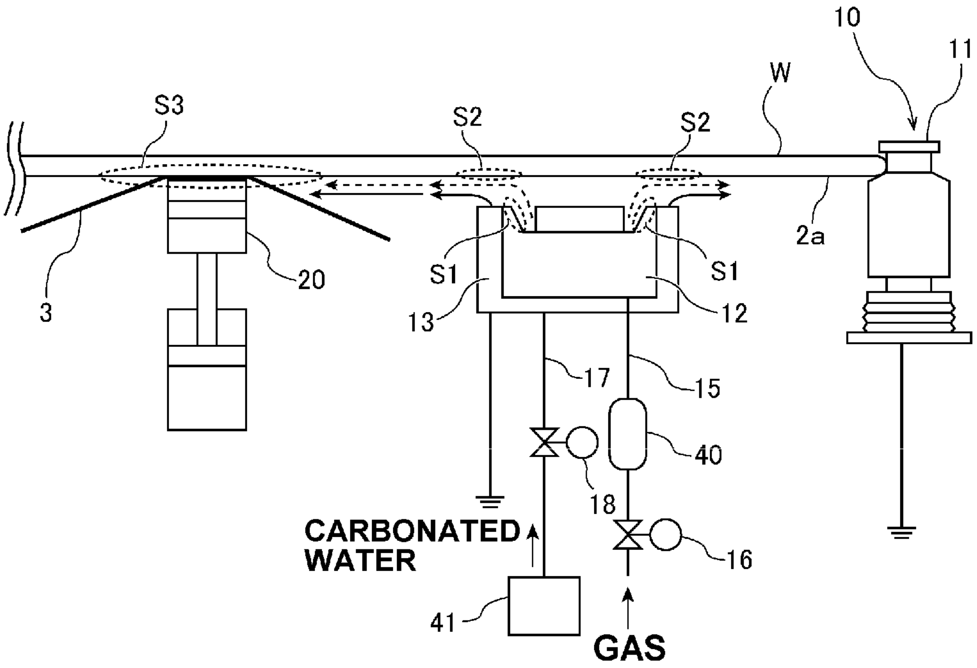
FIG. 8 is a schematic diagram illustrating the workpiece when being polished while the workpiece supporting device shown in FIGS. 7A and 7B supports the workpiece.
Figure 9:
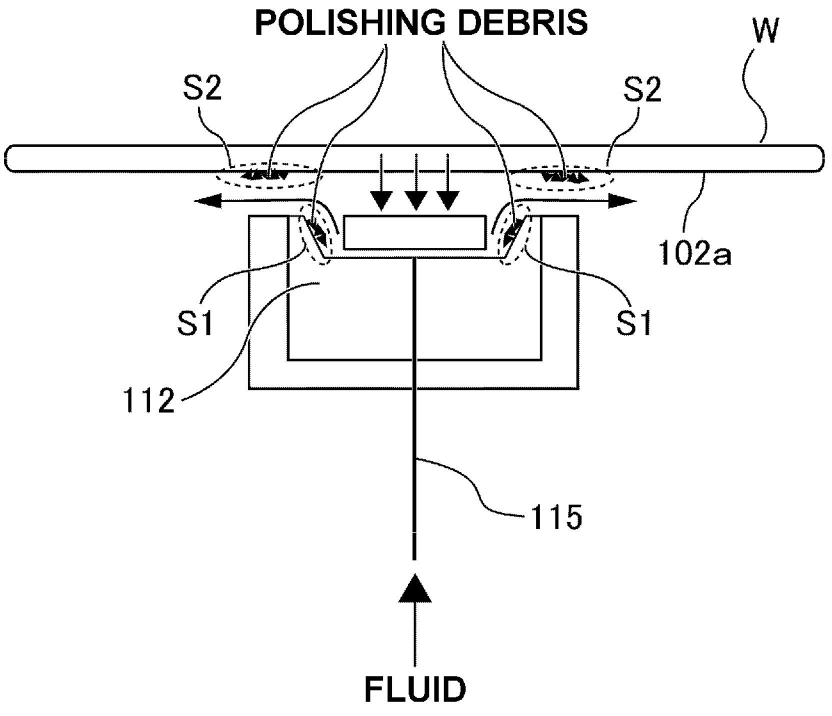
FIG. 9 is a schematic diagram illustrating a Bernoulli chuck when supporting a workpiece.

FIG. 8 is a schematic diagram illustrating the workpiece W when being polished while the workpiece supporting device 10 shown in FIGS. 7A and 7B supports the workpiece W. In FIG. 8, the ionized gas is indicated by dashed arrows, and the carbonated water is indicated by solid arrows. The ionized gas is emitted from the Bernoulli chuck 12 and spreads along the first surface 2*a* of the workpiece W. The carbonated water is emitted from the liquid ejecting member 13 and spreads along the first surface 2*a* of the workpiece W. The ionized gas and the carbonated water can neutralize the charge in the charged portions to be able to remove the static electricity. Therefore, the Bernoulli chuck 12 and the liquid ejecting member 13 of this embodiment can remove the static electricity from the charged portions indicated by S1 and S2. Furthermore, the ionized gas and the carbonated water spread along the first surface 2*a* of the workpiece W and reach the charged portion S3 of the workpiece W, so that the static electricity can be removed from the charged portion S3.

At least a part of the Bernoulli chuck 12 and/or at least a part of the liquid ejecting member 13 of the embodiment shown in FIGS. 7A, 7B, and 8 may be made of a conductive material and may be grounded. In particular, a portion of the Bernoulli chuck 12 facing the first surface 2*a* of the workpiece W and/or a portion of the liquid ejecting member 13 facing the first surface 2*a* of the workpiece W may be made of a conductive material, and may be grounded. Similarly, each roller 11 may be made of a conductive material and may be grounded. As a result, the static electricity generated in the portions indicated by S1 can be removed via the Bernoulli chuck 12 and/or the liquid ejecting member 13. Furthermore, the static electricity generated in the portions indicated by S2 and S3 can be removed via the roller 11.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

INDUSTRIAL APPLICABILITY

The present invention is applicable to a workpiece processing apparatus and a workpiece processing method for processing a workpiece, such as a wafer, a substrate, or a panel.

REFERENCE SIGNS LIST

1 polishing apparatus (workpiece processing apparatus)
2*a* first surface
2*b* second surface
3 polishing tape (processing tool)
10 workpiece supporting device
11 roller
12 Bernoulli chuck
12*a* attracting surface
12*b* fluid ejecting port
12*c* fluid flow passage
13 liquid ejecting member
13*a* liquid ejecting port
13*b* liquid flow passage
13*c* side wall
13*d* bottom
15 fluid supply line
16 fluid supply valve
17 carbonated-water supply line
18 carbonated-water supply valve
20 polishing head (processing head)
21 pressing member
22 pressing mechanism
30 polishing-tape feeding mechanism
31 tape feeding reel
32 tape take-up reel
33 reel base
34 guide roller
40 ionizer
41 carbonated-water supply source
41A pure-water line
41B carbon-dioxide-gas line
50 operation controller

The invention claimed is:

1. A workpiece processing apparatus for processing a surface of a workpiece, comprising:

a workpiece supporting device configured to support the workpiece; and a processing head configured to process the surface of the workpiece, wherein the workpiece supporting device has a fluid supply line for passing fluid therethrough, and a Bernoulli chuck coupled to the fluid supply line, the Bernoulli chuck is configured to attract the surface of the workpiece by emitting the fluid, and at least part of the Bernoulli chuck is made of a conductive material and is grounded, wherein the workpiece supporting device further has rollers configured to come into a rolling contact with an edge portion of the workpiece to rotate the workpiece, wherein the rollers are configured to be rotatable about their own axes, respectively, wherein positions of the rollers are stationary during rotation of the workpiece, and wherein at least part of each roller is made of a conductive material and is grounded.

2. The workpiece processing apparatus according to claim 1, wherein the fluid comprises gas, and the workpiece supporting device further has an ionizer configured to ionize the gas flowing through the fluid supply line.

3. The workpiece processing apparatus according to claim 2, wherein the ionizer is provided in the fluid supply line, and the Bernoulli chuck is coupled to the ionizer by the fluid supply line.

4. The workpiece processing apparatus according to claim 1, wherein the fluid comprises carbonated water, the workpiece supporting device further has a carbonated-water supply source, and the fluid supply line is coupled to the carbonated-water supply source.

5. The workpiece processing apparatus according to claim 1, wherein the conductive material comprises a conductive resin or a conductive ceramic.

6. A workpiece processing apparatus for processing a surface of a workpiece, comprising:

a workpiece supporting device configured to support the workpiece; and a processing head configured to process the surface of the workpiece, wherein the workpiece supporting device includes:

a fluid supply line for passing gas therethrough;

an ionizer configured to ionize the gas flowing through the fluid supply line, the ionizer being coupled to the fluid supply line;

a Bernoulli chuck coupled to the fluid supply line and configured to attract the surface of the workpiece by emitting the ionized gas, the Bernoulli chuck being coupled to the ionizer by the fluid supply line;

a liquid ejecting member surrounding the Bernoulli chuck and configured to emit carbonated water around the Bernoulli chuck; and a carbonated-water supply source for supplying the carbonated water to the liquid ejecting member.

7. The workpiece processing apparatus according to claim 6, wherein at least a part of the Bernoulli chuck and/or at least a part of the liquid ejecting member is made of a conductive material and is grounded.

8. The workpiece processing apparatus according to claim 6, wherein the workpiece supporting device further has rollers configured to make a rolling contact with an edge portion of the workpiece, wherein the rollers are configured to be rotatable about their own axes, respectively, wherein positions of the rollers are stationary during rotation of the workpiece, and at least part of each roller is made of a conductive material and is grounded.

9. The workpiece processing apparatus according to claim 6, wherein the conductive material comprises a conductive resin or a conductive ceramic.

10. A workpiece processing method of processing a surface of a workpiece, comprising:

bringing rollers into rolling contact with an edge portion of the workpiece while rotating the rollers about their own axes, respectively, to thereby rotate the workpiece, wherein positions of the rollers are stationary during rotation of the workpiece, and at least part of each roller is made of a conductive material and is grounded;

attracting the surface of the workpiece by a Bernoulli chuck by emitting fluid from the Bernoulli chuck; and processing the surface of the workpiece by a processing head while the workpiece is attracted by the Bernoulli chuck, wherein at least part of the Bernoulli chuck is made of a conductive material and is grounded.

11. The workpiece processing method according to claim 10, wherein the fluid emitted from the Bernoulli chuck comprises an ionized gas.

12. The workpiece processing method according to claim 11, wherein an ionizer is provided in a fluid supply line, and the Bernoulli chuck is coupled to the ionizer by the fluid supply line.

13. The workpiece processing method according to claim 10, wherein the fluid emitted from the Bernoulli chuck comprises carbonated water.

14. A workpiece processing method of processing a surface of a workpiece, comprising:

delivering a gas through a fluid supply line to a Bernoulli chuck while ionizing the gas flowing through the fluid supply line by an ionizer, the ionizer being coupled to the fluid supply line, the Bernoulli chuck being coupled to the ionizer through the first supply line;

emitting carbonated water to the surface of the workpiece from a liquid ejecting member surrounding the Bernoulli chuck, while attracting the surface of the workpiece by the Bernoulli chuck by emitting an ionized gas from the Bernoulli chuck; and processing the surface of the workpiece by a processing head while the workpiece is attracted by the Bernoulli chuck.

15. The workpiece processing method according to claim 14, wherein at least a part of the Bernoulli chuck and/or at least a part of the liquid ejecting member is made of a conductive material and is grounded.

16. The workpiece processing method according to claim 14, further comprising bringing rollers into rolling contact with an edge portion of the workpiece while rotating the rollers about their own axes, respectively, to thereby rotate the workpiece, wherein positions of the rollers are stationary during rotation of the workpiece, and at least part of each roller is made of a conductive material and is grounded.

* * * * *